US011792953B2

(12) United States Patent
Chehade et al.

(10) Patent No.: US 11,792,953 B2
(45) Date of Patent: Oct. 17, 2023

(54) RACK SYSTEM AND METHOD FOR POSITIONING A DATA CENTER RACK

(71) Applicant: OVH, Roubaix (FR)

(72) Inventors: Ali Chehade, Moncheaux (FR); Alexandre Alain Jean-Pierre Meneboo, Harnes (FR); Gregory Francis Louis Bauchart, Wattrelos (FR)

(73) Assignee: OVH, Roubaix (FR)

( * ) Notice: Subject to any disclaimer, the term of this patent is extended or adjusted under 35 U.S.C. 154(b) by 0 days.

(21) Appl. No.: 17/677,197

(22) Filed: Feb. 22, 2022

(65) Prior Publication Data

US 2022/0279673 A1    Sep. 1, 2022

(30) Foreign Application Priority Data

Feb. 26, 2021    (EP) .................................... 21305241

(51) Int. Cl.
  *H05K 7/18*    (2006.01)
  *B21D 5/00*    (2006.01)
  *H05K 7/14*    (2006.01)

(52) U.S. Cl.
  CPC .................. *H05K 7/18* (2013.01); *B21D 5/00* (2013.01); *H05K 7/1488* (2013.01)

(58) Field of Classification Search
  CPC ...... H05K 7/18; H05K 7/1488; H05K 7/1497; B21D 5/00; G11B 33/12; G11B 33/123; F16M 13/022; F16M 13/02; F16M 13/025
  See application file for complete search history.

(56) References Cited

U.S. PATENT DOCUMENTS

| | | | |
|---|---|---|---|
| 5,209,356 A * | 5/1993 | Chaffee ................ | A47B 81/064 361/725 |
| 5,664,688 A | 9/1997 | Kitanaka et al. | |
| 7,012,808 B2 * | 3/2006 | Mayer .................. | H05K 7/1489 361/826 |
| 8,047,621 B2 * | 11/2011 | Walburn .............. | A47B 88/956 312/265.5 |
| 8,848,378 B2 * | 9/2014 | Liao ...................... | H05K 7/1489 248/224.8 |
| 8,967,392 B1 | 3/2015 | Czamara et al. | |

(Continued)

OTHER PUBLICATIONS

Extended European Search Report with regard to the counterpart EP Patent Application No. 21305241.8 completed Aug. 19, 2021.

*Primary Examiner* — Ko H Chan
(74) *Attorney, Agent, or Firm* — BCF LLP

(57) ABSTRACT

A method is provided for positioning a data center rack relative to a rack-supporting frame. The method includes connecting at least one front attachment member to the data center rack on a front side thereof such that part of one of the at least one front attachment member and part of one of the at least one front attachment member extend leftward from a left end and rightward from a right end respectively of the data center rack; lifting and inserting the data center rack between a left and a right vertical support units until the at least one front attachment member abuts the left and right vertical support units; and moving the data center rack leftward or rightward until a hook portion of the at least one front attachment member engages the left or right vertical support unit to set a lateral position of the data center rack.

20 Claims, 11 Drawing Sheets

(56) References Cited

U.S. PATENT DOCUMENTS

| | | | |
|---|---|---|---|
| 9,326,414 B2 * | 4/2016 | Eberle, Jr. | H05K 7/1491 |
| 10,485,133 B1 * | 11/2019 | Revol | H05K 7/186 |
| 2002/0179552 A1 * | 12/2002 | Marraffa | H01M 50/204 |
| | | | 211/186 |
| 2004/0227443 A1 * | 11/2004 | Sandoval | H05K 7/1411 |
| | | | 312/334.44 |
| 2006/0180556 A1 * | 8/2006 | Shih | H05K 7/1489 |
| | | | 211/26 |
| 2010/0200716 A1 * | 8/2010 | White, III | A47B 96/06 |
| | | | 29/238 |
| 2013/0094899 A1 | 4/2013 | Fan | |
| 2014/0185246 A1 * | 7/2014 | Sun | H05K 7/18 |
| | | | 361/724 |
| 2017/0257969 A1 * | 9/2017 | Kuan | E05B 65/46 |
| 2019/0357377 A1 | 11/2019 | Keehn et al. | |

* cited by examiner

RACK SYSTEM AND METHOD FOR POSITIONING A DATA CENTER RACK

CROSS REFERENCE

The present application claims priority from European Patent Application No. EP21305241.8, filed on Feb. 26, 2021, the entirety of which is incorporated by reference herein.

FIELD OF TECHNOLOGY

The present technology relates to rack systems for data centers and to methods for positioning data center racks.

BACKGROUND

Data centers incorporate various racks which can support different types of equipment such as computing equipment (e.g., servers), network equipment, power equipment and/or cooling equipment. In some cases, these racks can be supported by a rack-supporting frame, particularly when the racks are to be positioned above one another.

Properly positioning the racks on a rack-supporting frame so as to avoid weight imbalances on the rack-supporting frame can be challenging. Notably, in many cases, an operator of a forklift or other lifting machine for handling the racks is guided by another person with a different vantage point to properly position the racks on the rack-supporting frame. In addition to being a time-consuming process, relying on a person's visual observation of the position of the rack on the rack-supporting frame may not be ideal as it can be subjective to the person observing the rack.

Furthermore, during use, the racks can be subject to vibrations which can affect their stability on the rack-supporting frame, particularly when the racks are positioned one above the other on the rack-supporting frame. For instance, in some cases, such vibrations may be generated by seismic activity at the location of the data center, or by the movement of heavy equipment in the data center.

There is therefore a desire for a rack system which can alleviate at least some of these drawbacks.

SUMMARY

It is an object of the present technology to ameliorate at least some of the inconveniences present in the prior art.

According to one aspect of the present technology, there is provided a method for positioning a data center rack relative to a rack-supporting frame, the rack-supporting frame comprising left and right vertical support units laterally spaced apart from one another, the method comprising: connecting at least one front attachment member to the data center rack on a front side thereof such that: part of one of the at least one front attachment member extends leftward from a left end of the data center rack; and part of one of the at least one front attachment member extends rightward from a right end of the data center rack; lifting the data center rack; inserting the data center rack between the left and right vertical support units until the at least one front attachment member abuts the left and right vertical support units; and moving the data center rack leftward or rightward until a hook portion of the at least one front attachment member engages the left vertical support unit or the right vertical support unit to set a lateral position of the data center rack between the left and right vertical support units.

In some embodiments, the method further comprises, after inserting the data center rack between the left and right vertical support units, lowering the data center rack until a bottom of the data center rack is supported.

In some embodiments, the method further comprises, after inserting the data center rack between the left and right vertical support units: connecting at least one rear attachment member to the data center rack on a rear side thereof such that: part of one of the at least one rear attachment member extends leftward from the left end of the data center rack; and part of one of the at least one rear attachment member extends rightward from the right end of the data center rack.

In some embodiments, when moving the data center rack leftward or rightward, a hook portion of the at least one rear attachment member engages the left vertical support unit or the right vertical support unit, the hook portion of the at least one front attachment and the hook portion of the at least one rear attachment member being disposed on a same lateral side of the data center rack, engagement of the hook portion of the at least one front attachment member and the hook portion of the at least one rear attachment member with the left vertical support unit or the right vertical support unit setting a lateral position of the data center rack between the left and right vertical support units.

In some embodiments, the method further comprises, after moving the data center rack leftward or rightward: connecting the part of the one of the at least one front attachment member that extends leftward from the left end of the data center rack to the left vertical support unit; and connecting the part of the one of the at least one front attachment member that extends rightward from the right end of the data center rack to the right vertical support unit.

In some embodiments, the method further comprises, after moving the data center rack leftward or rightward: connecting the part of the one of the at least one rear attachment member that extends leftward from the left end of the data center rack to the left vertical support unit; and connecting the part of the one of the at least one rear attachment member that extends rightward from the right end of the data center rack to the right vertical support unit.

In some embodiments, the at least one front attachment member includes a front left attachment member and a front right attachment member; and connecting the at least one front attachment member to the data center rack comprises: connecting the front left attachment member to the data center rack on the front side thereof such that part of the front left attachment member extends leftward from the left end of the data center rack; and connecting the front right attachment member to the data center rack on the front side thereof such that part of the front right attachment member extends rightward from the right end of the data center rack.

According to another aspect of the present technology, there is provided a rack system comprising: a rack-supporting frame comprising a left vertical support unit and a right vertical support unit laterally spaced apart from one another; a data center rack positioned between the left vertical support unit and the right vertical support unit, the data center rack having a front side and a rear side opposite the front side; at least one front attachment member connected to the data center rack on the front side thereof, part of one of the at least one front attachment member extending leftward from a left end of the data center rack and being connected to the left vertical support unit, part of one of the at least one front attachment member extending rightward from a right end of the data center rack and being connected to the right vertical support unit; and at least one rear attachment member connected to the data center rack on the rear side thereof, part of one the at least one rear attachment member extending leftward from the left end of the data center rack and being connected to the left vertical support unit, part of one of the at least one rear attachment member extending rightward from the right end of the data center rack and being connected to the right vertical support unit, the at least one front attachment member comprising a hook portion abutting a surface of a corresponding one of the left and right vertical support units to set a lateral position of the data center rack between the left and right vertical support units.

According to another aspect of the present technology, there is provided a rack system comprising: a rack-supporting frame comprising a left vertical support unit and a right vertical support unit laterally spaced apart from one another; a data center rack positioned between the left vertical support unit and the right vertical support unit, the data center rack having a front side and a rear side spaced apart in a depth direction of the data center rack; a plurality of attachment members connecting the data center rack to the rack-supporting frame, each attachment member of the plurality of attachment members comprising: a rack attachment portion connected to the data center rack; a frame attachment portion connected to a corresponding one of the left and right vertical support units; and a spring portion extending between the rack attachment portion and the frame attachment portion, the spring portion allowing elastic deformation of the attachment member such that the rack attachment portion is movable relative to the frame attachment portion, the rack attachment portion, the frame attachment portion and the spring portion being integrally connected to one another.

In some embodiments, each attachment member of the plurality of attachment members is a plate member formed by bending such that the rack attachment portion, the frame attachment portion and the spring portion thereof are different sections of the plate member.

In some embodiments, for each attachment member of the plurality of attachment members, the rack attachment portion is generally parallel to the frame attachment portion.

In some embodiments, for each attachment member of the plurality of attachment members, the spring portion extends at least partly in the depth direction of the data center rack.

In some embodiments, for each attachment member of the plurality of attachment members, the spring portion extends at a non-right angle relative to the rack attachment portion and the frame attachment portion.

In some embodiments, wherein the spring portion is generally planar.

In some embodiments of the system, for each attachment member of the plurality of attachment members, the spring portion comprises: a first section extending from the rack attachment portion; a second section extending from the frame attachment portion, the second section being generally parallel to the first section; and a third section extending between the first and second sections, the third section extending an angle relative to the first and second sections.

According to another aspect of the present technology, there is provided a data center rack comprising: a front side and a rear side spaced apart in a depth direction of the data center rack; a plurality of attachment members for connecting the data center rack to a rack-supporting frame, each attachment member of the plurality of attachment members comprising: a rack attachment portion connected to the data center rack; a frame attachment portion configured to be connected to a corresponding one of a left vertical support unit and a right vertical support unit of the rack-supporting frame; and a spring portion extending between the rack attachment portion and the frame attachment portion, the spring portion allowing elastic deformation of the attachment member such that the rack attachment portion is movable relative to the frame attachment portion, the rack attachment portion, the frame attachment portion and the spring portion being integrally connected to one another.

In some embodiments, each attachment member of the plurality of attachment members is a plate member formed by bending such that the rack attachment portion, the frame attachment portion and the spring portion thereof are different sections of the plate member.

In some embodiments, for each attachment member of the plurality of attachment members, the rack attachment portion is generally parallel to the frame attachment portion.

In some embodiments, for each attachment member of the plurality of attachment members, the spring portion extends at least partly in the depth direction of the data center rack.

In some embodiments, or each attachment member of the plurality of attachment members, the spring portion extends at a non-right angle relative to the rack attachment portion and the frame attachment portion.

In some embodiments, the spring portion is generally planar.

In some embodiments, for each attachment member of the plurality of attachment members, the spring portion comprises: a first section extending from the rack attachment portion; a second section extending from the frame attachment portion, the second section being generally parallel to the first section; and a third section extending between the first and second sections, the third section extending an angle relative to the first and second sections.

According to another aspect of the present technology, there is provided a rack system comprising: a rack-supporting frame comprising a left vertical support unit and a right vertical support unit laterally spaced apart from one another; and the above-described data center rack positioned between the left vertical support unit and the right vertical support unit.

Embodiments of the present technology each have at least one of the above-mentioned objects and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of embodiments of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

DETAILED DESCRIPTION

In the present description, various terms relating to spatial orientation such as "front", "rear", "top", "bottom", "left", "right", "upward", "downward", etc. will be used to provide a clear description of the present technology. However, it is understood that these terms are merely used to improve the clarity of the description and in no way are meant to be limiting in regard to orientation.

Figure 1:
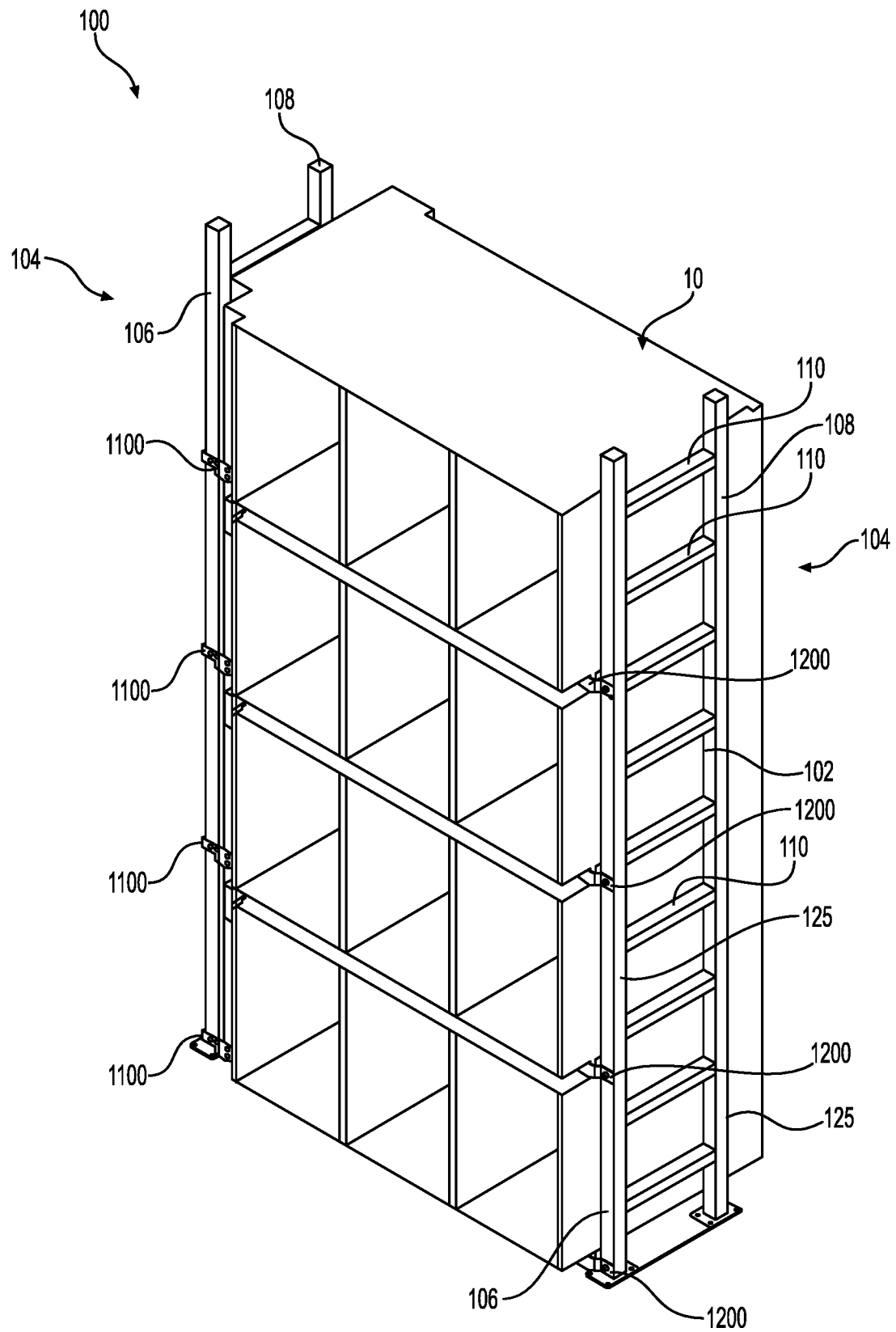
FIG. 1 is a perspective view of a rack system according to an embodiment of the present technology.

FIG. 1 illustrates a rack system 100 for a data center including a rack-supporting frame 102 and a plurality of racks 10 (only four of which are shown in FIG. 1) that are configured to be supported by the rack-supporting frame 102. The rack-supporting frame 102 is provided to align the racks 10 in a row as is a common practice in data centers, notably to help manage heat within the data center. In use, a data center would include multiple rack-supporting frames 102 to form multiple rows of racks 10. The racks 10 are configured to support data center equipment therein, including for example computer systems such as servers and related supporting equipment (e.g., heat exchangers for heat dissipation of the computer systems). As such, the racks 10 may be referred as "data center racks".

The rack-supporting frame 102 includes multiple vertical support units 104, only two of which are shown in FIG. 1. As can be seen, the vertical support units 104 are laterally spaced from one another. The vertical support units 104 are anchored to a ground surface of the data center. The vertical support units 104 have been illustrated schematically as two upstanding blocks. However, in practice, each vertical support unit 104 may comprise a number of frame components interconnected to one another to form the vertical support unit 104. The rack-supporting frame 102 is designed so that the width of one rack 10 can fit between each pair of the vertical support units 104. As will be explained in more detail below, multiple racks 10 (e.g., two or three racks) can be disposed above one another between each pair of the vertical support units 104.

As shown in FIG. 1, in this embodiment, each vertical support unit 104 includes one front elongated vertical member 106, one rear elongated vertical member 108 and a plurality of front-to-rear elongated members 110 that extend in part in a depth direction (i.e., front-to-rear direction) of the rack-supporting frame 102 and interconnect the front and rear elongated vertical members 106, 108. In this embodiment, the front-to-rear elongated members 110 extend generally horizontally but they may extend diagonally in other embodiments. For instance, each front-to-rear elongated member 110 may extend either upwardly and rearwardly or downwardly and rearwardly from a front vertical member 106 to a corresponding rear vertical member 108 that is laterally aligned with that front vertical member 106. The vertical support units 104 could be configured differently in other embodiments.

Figure 2:
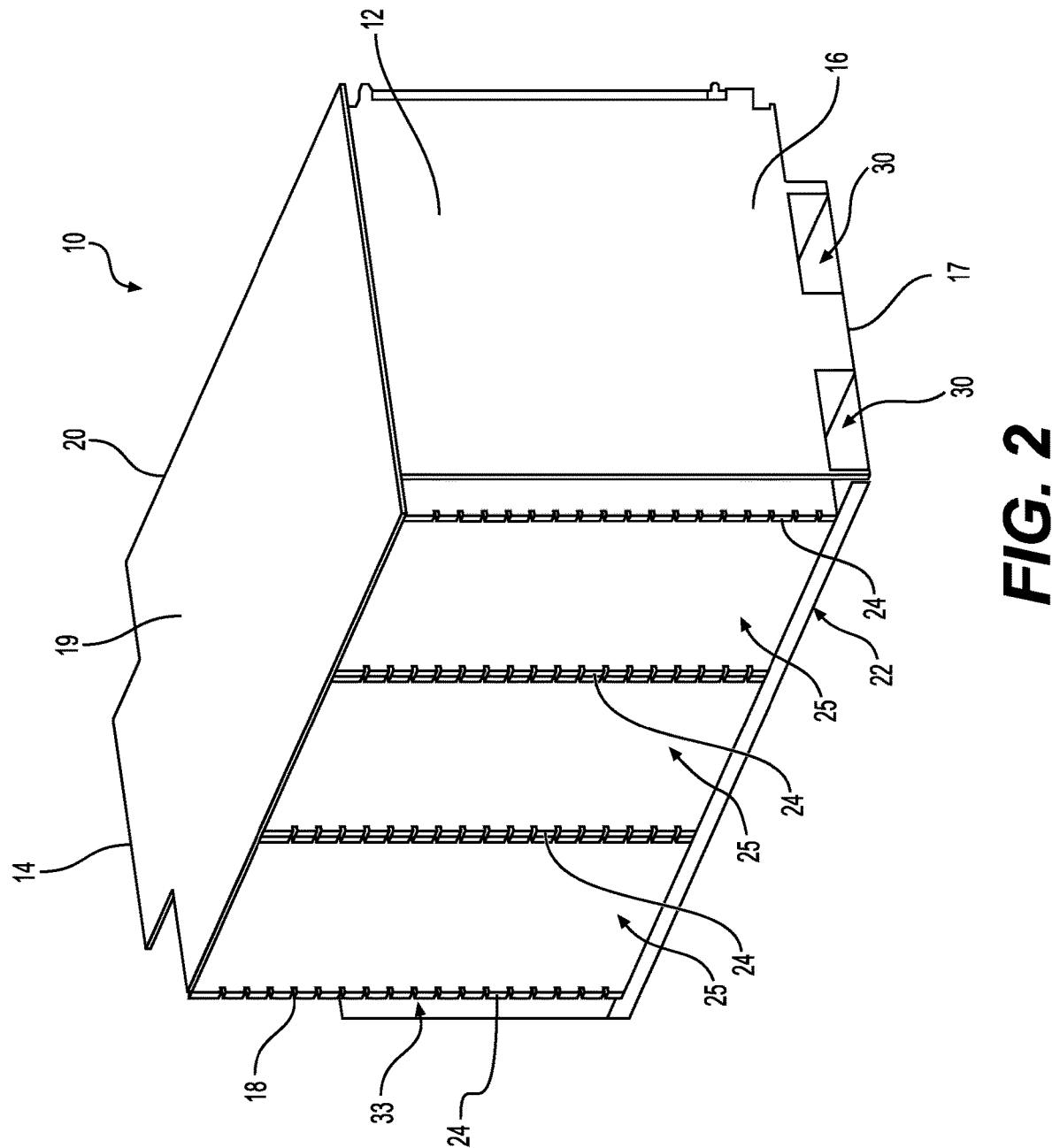
FIG. 2 is a perspective view, taken from a front, top, right side, of a rack of the rack system of FIG. 1.
Figure 3:
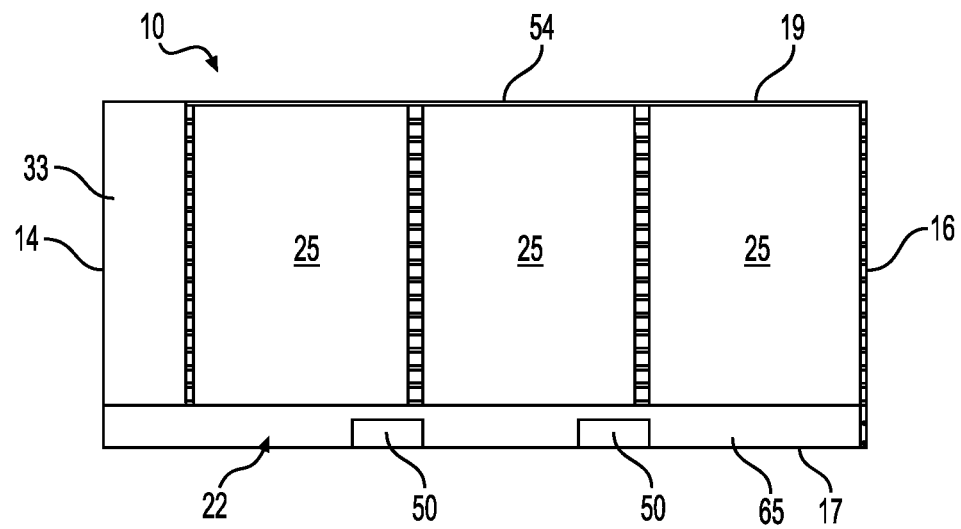
FIG. 3 is a front elevation view of the rack of FIG. 2.
Figure 4:
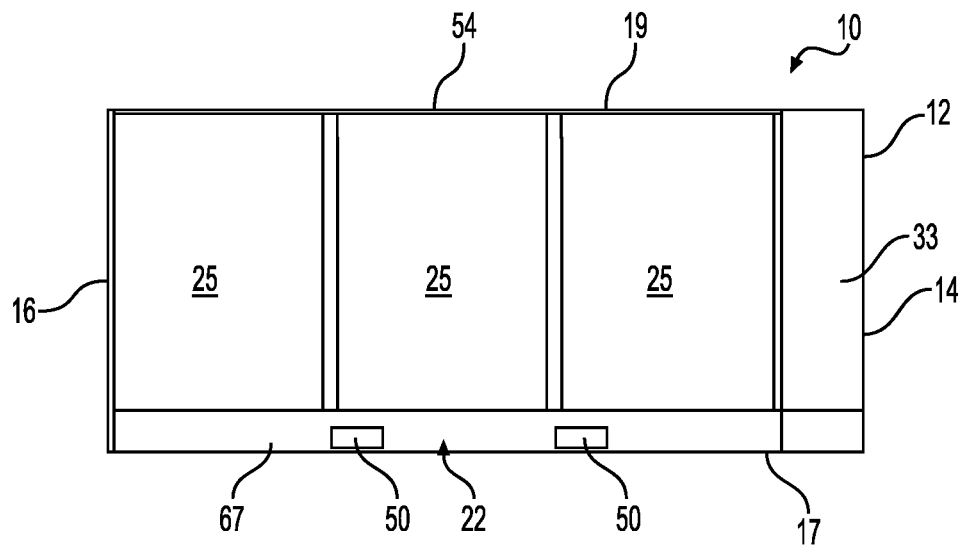
FIG. 4 is a rear elevation view of the rack of FIG. 2.

With reference to FIGS. 2 to 4, each rack 10 has a left lateral end 14 and a right lateral end 16 which are opposite one another in the lateral direction. A front end 18 is disposed on a front side of the rack 10 and a rear end 20 on a rear side of the rack 10. As can be seen, the rack 10 has a greater width, measured between the lateral ends 14, 16, than a height thereof, measured between a lower end 17 and an upper end 19 of the rack 10. As such, the rack 10 can be said to be horizontally-extending rather than vertically-extending.

A frame 12 of the rack 10 has a base 22 defining a bottom portion of the rack 10. The base 22 has a front wall 65 on the front side of the rack 10 and a rear wall 67 on the rear side of the rack 10. The frame 12 also has a plurality of vertical wall supports 24 that are fastened to the base 22 and extend upwardly therefrom. The vertical wall supports 24 are laterally spaced from one another so as to define housing sections 25 therebetween. In this embodiment, the frame 12 includes four vertical wall supports 24 which define three housing sections 25 between adjacent ones of the vertical wall supports 24. A plurality of mounts (not shown) may be connected to the vertical wall supports for the servers to be mounted thereto.

In this embodiment, at the left lateral end 14, the frame 12 has an end frame enclosure 33 for housing additional equipment to service the servers supported by the rack 10. The end frame enclosure 33 includes two sheet metal components that are mechanically fastened to the base 22 and extend upwardly therefrom. The end frame enclosure 33 may be omitted in other embodiments.

An upper frame member 54 extends parallel to the base 22 and defines at least in part the upper end 19 of the rack 10. The upper frame member 54 interconnects the upper ends of the vertical wall supports 24 as well as the upper end of the end frame enclosure 33. In this embodiment, the upper frame member 54 is a generally planar sheet metal component that is fastened to the upper ends of the vertical wall supports 24 and the upper end of the end frame enclosure 33.

The rack 10 is designed to be lifted by a forklift or other lifting machine having a fork (e.g., a stacker or a pallet jack). To that end, as shown in FIGS. 2 and 3, in this embodiment, the base 22 defines two openings 50, extending from the front wall 65 of the base 22 on the front side of the rack 10 to the rear wall 65 of the base 22 on the rear side of the rack 10, for receiving a fork of the lifting machine along the depth direction. More specifically, each opening 50 can receive a respective arm of the fork of the lifting machine. As shown in FIG. 2, in this embodiment, the rack 10 also defines two openings 30 extending in the lateral direction, from one lateral end of the base 22 to the opposite lateral end of the base 22, for receiving a fork of the lifting machine along the lateral direction. In other embodiments, the openings 30 may be omitted.

As will be described below, a plurality of attachment members 1100, 1200 are provided to position the rack 10 between two of the vertical support units 104, namely a left vertical support unit 104 and a right vertical support unit 104, and to connect the rack 10 thereto. In particular, in this embodiment, two front attachment members 1100, 1200 and two rear attachment members 1100, 1200 are provided, namely front left and front right attachment members 1100, 1200 and rear left and rear right attachment members 1100, 1200.

Figure 5:
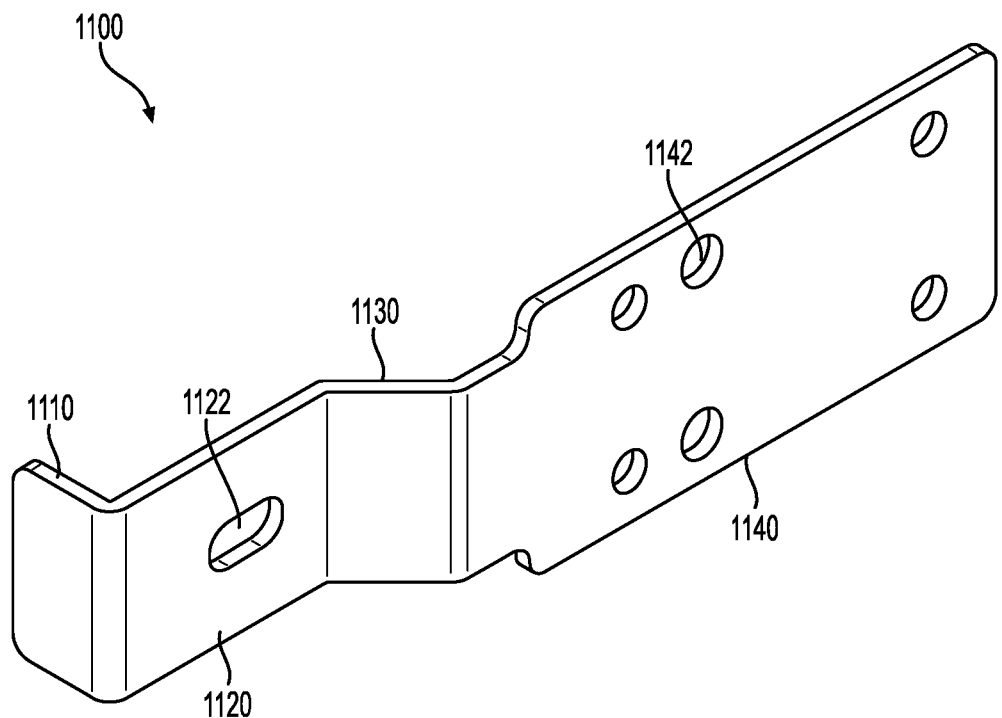
FIG. 5 is a perspective view of a front left attachment member of the rack system of FIG. 1.

The front left attachment member 1100 will now be described with reference to FIG. 5. In this embodiment, the rear left attachment member 1100 is a mirror image of the front left attachment member 1100. Therefore, only the front left attachment member 1100 will be described in detail herein. It is to be understood that the same description applies to the rear left attachment member 1100. As shown in FIG. 5, in this embodiment, the front left attachment member 1100 has a hook portion 1110, a frame attachment portion 1120, a rack attachment portion 1140 and a spring portion 1130 extending between the frame attachment portion 1120 and the rack attachment portion 1140. As can be seen, in this embodiment, the front left attachment member 1100 is a single integral component. In particular, the front left attachment member 1100 is made of a single piece of sheet metal bent into shape. The front left attachment member 1100 can thus be manufactured easily and relatively inexpensively.

The frame attachment portion 1120 and the rack attachment portion 1140 are configured to be connected to the left vertical support unit 104 and to the rack 10 respectively. To that end, the frame attachment portion 1120 defines an opening 1122 for receiving a fastener (e.g., a bolt) therein that engages the left vertical support unit 104, and the rack attachment portion 1140 defines a plurality of openings 1142 through which fasteners (e.g., bolts) are inserted to connect the front left attachment member 1100 to the base 22 of the rack 10. Different numbers of openings may be provided in each of the frame attachment portion 1120 and the rack attachment portion 1140 in other embodiments. Furthermore, in this embodiment, the opening 1122 of the frame attachment portion 1120 is a slot to allow some variation in the position of the corresponding opening of the left vertical support unit 104 that receives the fastener inserted through the opening 1122. Additionally, in some embodiments, the hook portion 1110 may comprise one or more openings (not depicted) for receiving a fastener (e.g. a bolt) to connect the hook portion 1110 to the left vertical support unit 104.

The frame attachment portion 1120 and the rack attachment portion 1140 are generally planar and define parallel planes. In other words, the frame attachment portion 1120 is generally parallel to the rack attachment portion 1140. It is contemplated that, in other embodiments, the frame attachment portion 1120 and the rack attachment portion 1140 may be coplanar and thus lie on a common plane.

The hook portion 1110 extends rearwardly from a left end of the frame attachment portion 1120. In particular, in this embodiment, the hook portion 1110 extends at a right angle relative to the frame attachment portion 1120. The hook portion 1110 may extend at other angles relative to the frame attachment portion 1120 in other embodiments. As will be explained in more detail below, the hook portion 1110 is configured to hook onto part of the left vertical support unit 104 to set the lateral position of the rack 10 relative to the rack-supporting frame 102.

The spring portion 1130 is configured to allow elastic deformation of the attachment member 1100. In particular, as will be explained below, the spring portion 1130 allows movement of the rack attachment portion 1140 relative to the frame attachment portion 1120. The spring portion 1130 extends from a right end of the frame attachment portion 1120 to a left end of the rack attachment portion 1140. The spring portion 1130 is generally planar and extends at least partly in a depth direction of the rack 10 at a non-right angle relative to the rack attachment portion 1140 and the frame attachment portion 1120. In particular, in this embodiment, the spring portion 1130 extends rearward and leftward from the right end of the rack attachment portion 1140 to the left end of the frame attachment portion 1120. As such, the left end of the frame attachment portion 1120 is offset, in the depth direction, from the right end of the rack attachment portion 1140.

Movement of the rack attachment portion 1140 relative to the frame attachment portion 1120 is allowed by bending of the attachment member 1100 about a junction between the spring portion 1130 and the frame attachment portion 1120 and/or around a junction between the spring portion 1130 and the rack attachment portion 1140. Therefore, the front left attachment member 1100, upon being affixed to the rack 10 and the rack-supporting frame 102, may absorb vibrations subjected by the rack system 100. The spring portion 1130 may thus allow the rack system 100 to more easily absorb vibrations generated by an environment of the rack system 100, such as vibrations caused by seismic activity, or by the displacement and/or installation of racks. This can in turn improve the stability of the racks 10 on the rack-supporting frame 102. Moreover, as will be understood, the elastic deformation of the front left attachment member 1100 is provided relatively inexpensively as it is a result of a bending operation to form the spring portion 1130, rather than having for example a separate resilient component to impart the elasticity of the front left attachment member 1100.

Figure 6A:
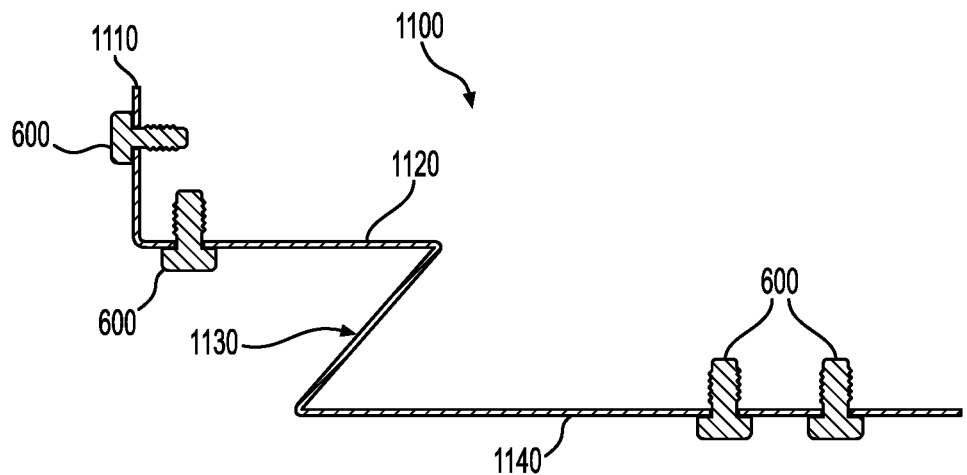
FIG. 6A is a top plan view of the front left attachment member in accordance with another embodiment.

It is contemplated that the spring portion 1130 may be shaped differently in other embodiments. Notably, in FIG. 6A and FIG. 6B, the front left attachment member 110 is depicted with alternative shapes of the spring portion 1130. In the illustrative embodiment of FIG. 6A, the front left attachment portion 1100 is Z-shaped and the spring portion 1130 is planar and extends along a single plane. Notably, the spring portion 1130 extends at acute angles from the rack attachment portion 1140 and from the frame attachment portion 1120. More precisely, the spring portion 1130 extends frontward and leftward from a right end of the frame attachment member 1120 to a left end of the rack attachment member 1140. In this embodiment, a portion of the frame attachment member 1120 and a portion the rack attachment member 1140 are laterally aligned. In other words, a portion of frame attachment member 1120 is located behind a portion of the rack attachment member 1140 on a front elevation view of the rack 10 when the front left attachment member 110 is affixed on the rack 10. FIG. 6A illustrates fasteners 600 inserted in an opening of the hook portion 1110, in the openings 1122 and in the openings 1142.

Figure 6B:
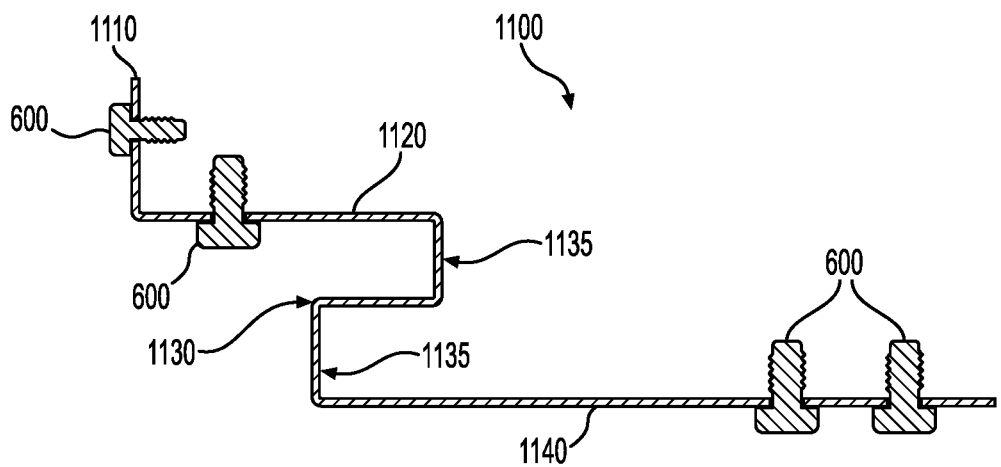
FIG. 6B is a top plan view of the front left attachment member in accordance with yet another embodiment.

In the illustrative embodiment of FIG. 6B, the spring portion 1130 comprises a plurality of planar sections 1135, each planar section 1135 extending at an angle from an adjacent planar section 1135. More precisely, the spring portion 1130 in the illustrative embodiment of the front left attachment member 1100 of FIG. 6B comprises three planar sections 1135, each planar section 1135 extending at a right angle from an adjacent planar section 1135 and/or from the frame attachment member 1120 and the rack attachment member 1140. In this embodiment, a portion of the frame attachment member 1120 and a portion the rack attachment member 1140 are laterally aligned. The spring portion 1130 may comprise a different number of planar sections 1135, and the planar sections 1135 may extend at different angles from adjacent planar sections. Additionally or alternatively, the spring portion 1130 may comprise non-planar sections such as sections defining circular arcs. Other alternatives of the spring portion 1130 may be contemplated.

It is contemplated that the spring portion 1130 may be omitted in some embodiments. For instance, in such embodiments, the rack attachment portion 1140 may be continuous with the frame attachment portion 1120 (without an intervening spring portion therebetween) and the rack attachment portion 1140 and the frame attachment portion 1120 may lie on a common plane.

Furthermore, it is contemplated that, in some embodiments, the front left attachment member 1100 could comprise two or more components interconnected to one another.

Figure 7:
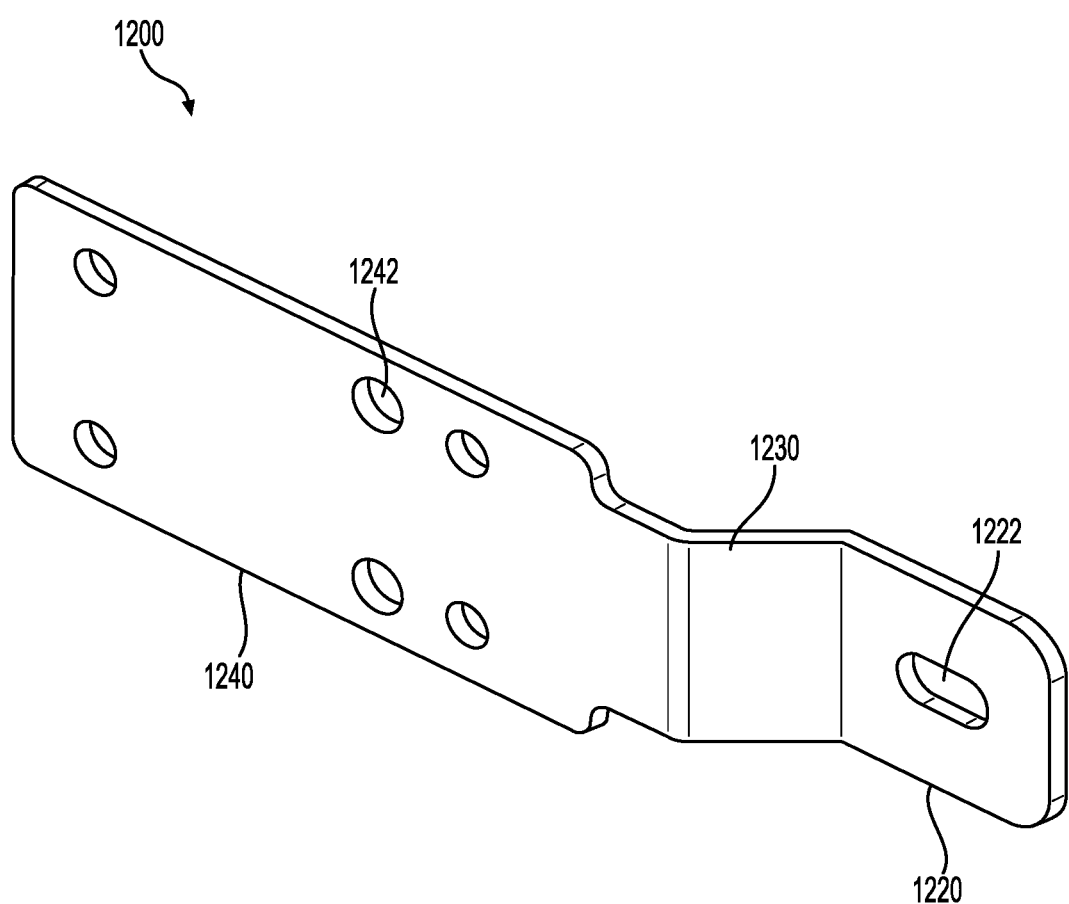
FIG. 7 is a perspective view of a front right attachment member of the rack system of FIG. 1.

The front right attachment member 1200 will now be described with reference to FIG. 7. In this embodiment, the rear right attachment member 1200 is a mirror image of the front right attachment member 1200. Therefore, only the front right attachment member 1200 will be described in detail herein. It is to be understood that the same description applies to the rear right attachment member 1200. As shown in FIG. 7, in this embodiment, the front right attachment member 1200 is substantially identical to the front left attachment member 1100 (mirrored so as to be attached to the right vertical support unit 104) with the exception that it does not have a hook portion such as the hook portion 1110. In particular, in this embodiment, the front right attachment member 1200 has a frame attachment portion 1220, a rack attachment portion 1240 and a spring portion 1230 extending between the frame attachment portion 1220 and the rack attachment portion 1240. As can be seen, in this embodiment, the front right attachment member 1200 is a single integral component. In particular the front right attachment member 1200 is made of a single piece of sheet metal bent into shape. The front right attachment member 1200 can thus be manufactured easily and relatively inexpensively.

The frame attachment portion 1220 and the rack attachment portion 1240 are configured to be connected to the right vertical support unit 104 and to the rack 10 respectively. To that end, the frame attachment portion 1220 defines an opening 1222 for receiving a fastener (e.g., a bolt) therein that engages the right vertical support unit 104, and the rack attachment portion 1240 defines a plurality of openings 1242 through which fasteners (e.g., bolts) are inserted to connect the front right attachment member 1200 to the base 22 of the rack 10. Different numbers of openings may be provided in each of the frame attachment portion 1220 and the rack attachment portion 1240 in other embodiments.

The frame attachment portion 1220 and the rack attachment portion 1240 are generally planar and define parallel planes. In other words, the frame attachment portion 1220 is generally parallel to the rack attachment portion 1240.

Similar to the spring portion 1130 of the front left attachment member 1100, the spring portion 1230 is configured to allow elastic deformation of the front right attachment member 1200. The spring portion 1230 may have alternative shapes such as the spring portion 1130 depicted in FIGS. 6A and 6B.

Figure 8:
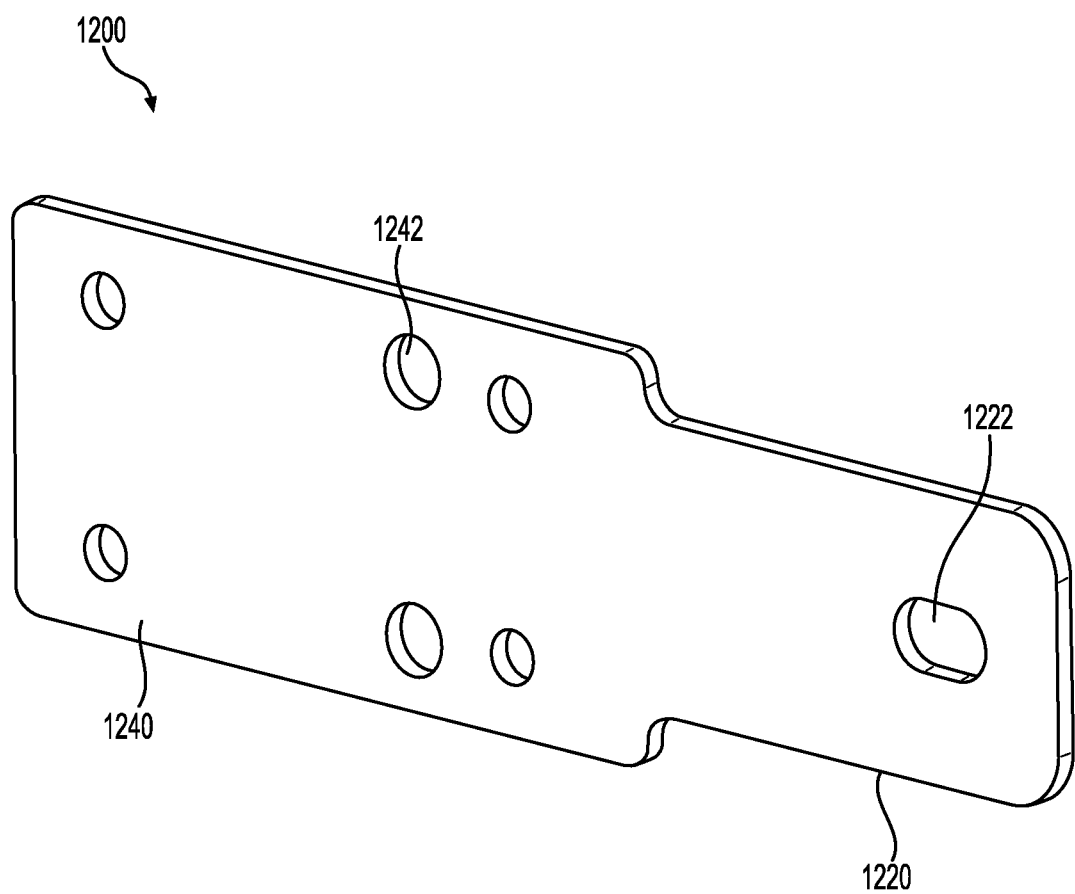
FIG. 8 is a perspective view of a front right attachment member according to another embodiment.

It is contemplated that the spring portion 1230 may be omitted in some embodiments. For instance, in the illustrative embodiment of FIG. 8, the rack attachment portion 1240 is continuous with the frame attachment portion 1220 (without an intervening spring portion therebetween) and the rack attachment portion 1240 and the frame attachment portion 1220 are coplanar and thus lie on a common plane. Additionally, the rack attachment portion 1240 and the frame attachment portion 1220 may have a different size or width as depicted in FIG. 8. Notably, in the illustrative embodiment, the rack attachment portion 1220 is larger than the frame attachment portion 1240.

Furthermore, it is contemplated that, in some embodiments, the front right attachment member 1200 could comprise two or more components interconnected to one another.

Figure 9:
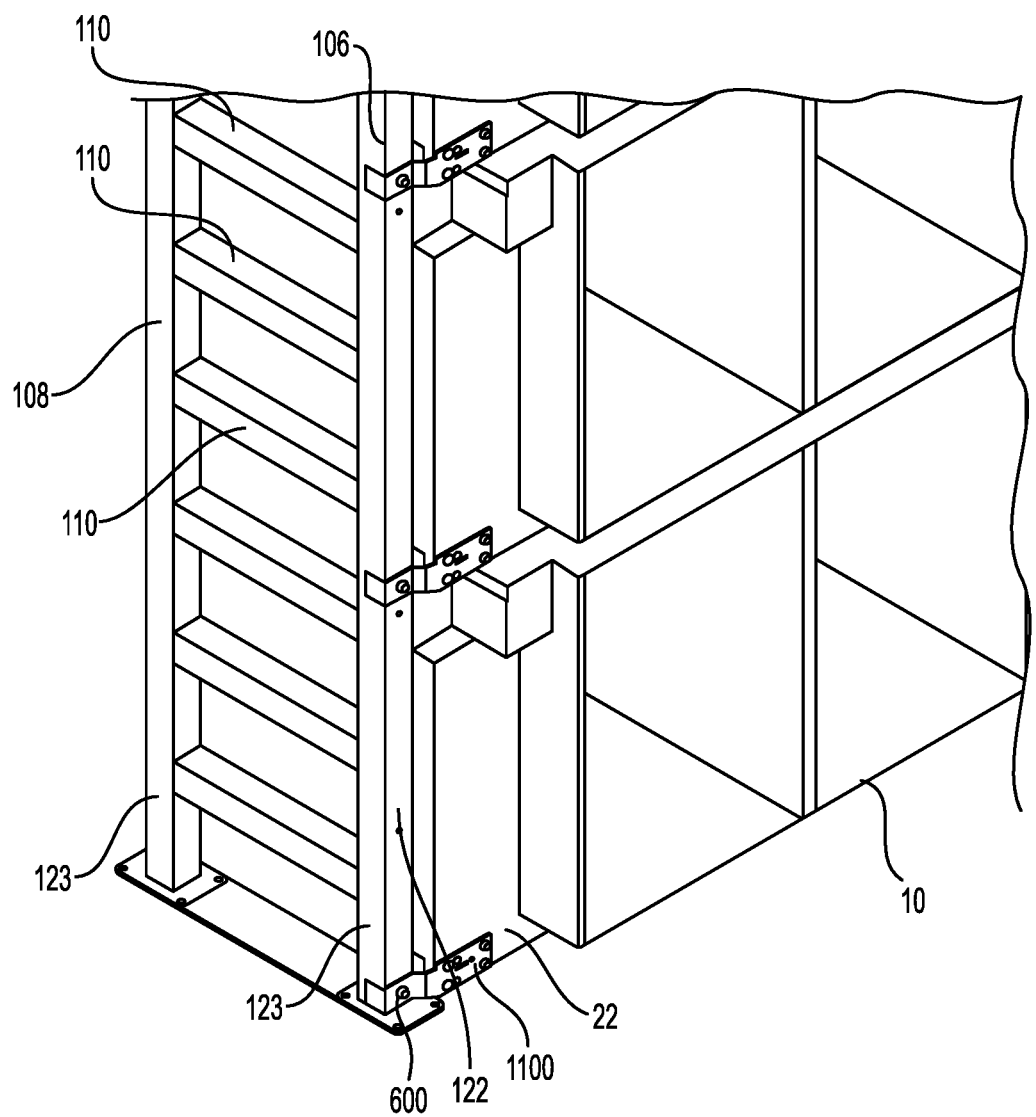
FIG. 9 is a perspective view of part of the rack system of FIG. 1, showing part of a rack connected to the rack-supporting frame of the rack system by the front left attachment member.
Figure 10:
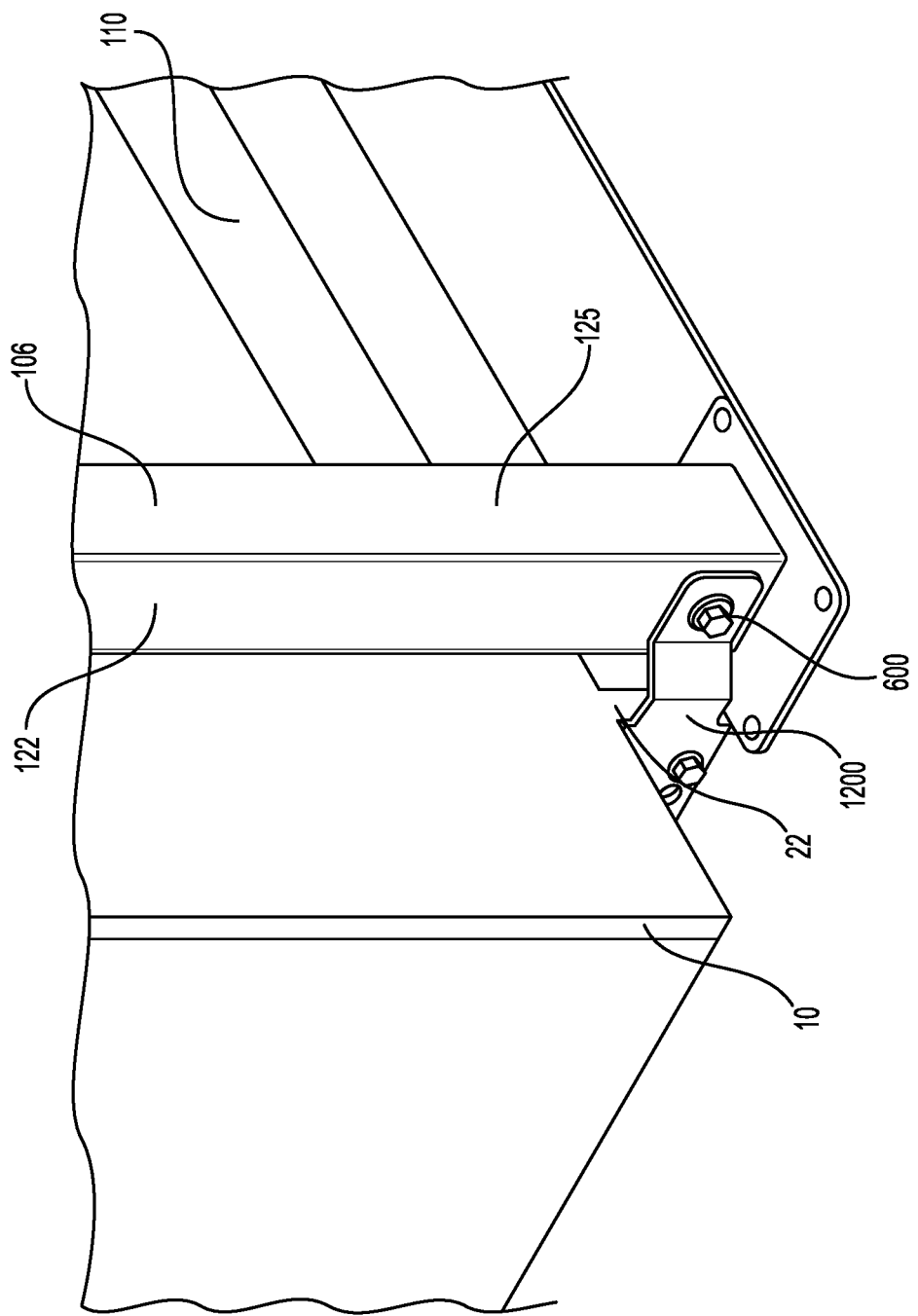
FIG. 10 is a perspective view of part of the rack system of FIG. 1, showing part of a rack connected to a rack-supporting frame of the rack system by the front right attachment member.

A method for positioning one of the racks 10 relative to the rack-supporting frame 102 via the attachment members 1100, 1200 will now be described in detail. First, the front left and front right attachment members 1100, 1200 are connected to the rack 10. In particular, as shown in FIGS. 9 and 10, the front left and front right attachment members 1100, 1200 are connected to the base 22 of the of the rack 10. In this embodiment, fasteners 600 (shown in the embodiments of FIGS. 6A, 6B), are inserted through the openings 1142, 1242 of the rack attachment portions 1140 and 1240 of the front left and front right attachment members 1100, 1200. Openings in the base 22 of the rack 10 are adapted to threadedly receive the fasteners 600, thereby securing the front left and front right attachment members 1100, 1200 to the rack 10. Once the front left and front right attachment members 1100, 1200 are connected to the rack 10, a part of each of the front left attachment member 1100 and the front right attachment member 1200 extends leftward and rightward respectively from a left end and a right end of the base 22 of the rack 10. Notably, in this embodiment, the hook portion 1110, the frame attachment portion 1120 and the spring portion 1130 of the front left attachment member 1100 extend leftward from the left end of the base 22 of the rack 10, while the frame attachment portion 1220 and the spring portion 1230 of the front right attachment member 1200 extend rightward from the right end of the base 22 of the rack 10.

With the attachment members 1100, 1200 connected to the rack 10, an operator of the lifting machine lifts the rack 10 and inserts the rack 10 between the left and right vertical support units 104 until the rear surfaces (not shown) of the front left and front right attachment members 1100 and 1200, in particular the rear surfaces defined by the frame attachment portions 1120, 1220 thereof, abut respective front end surfaces 122 of the left and right vertical support units 104. In this embodiment, the front end surfaces 122 are defined by the front elongated vertical members 106 of the left and right vertical support units 104. The front end surfaces 122 may be defined by any suitable members of the left and right vertical support units 104 in other configurations of the left and right vertical support units 104. More precisely, the operator of the lifting machine manoeuvres the lifting machine to lift and align the rack 10 to be between the left and right vertical support units 104 in the lateral direction and the rack 10 is then inserted between the left and right vertical support units 104 in a front-to-rear motion direction until the rear surfaces of the frame attachment portions 1120, 1220 of the front left and front right attachment members 1100, 1200 abut the front end surfaces 122 of the left and right vertical support units 104. That is, the rack 10 is moved between the left and right vertical support units 104 with the rear end 20 facing rearwardly and the front end 18 facing frontwardly until the front left and front right attachment members 1100, 1200 abut the left and right vertical support units 104.

In this position, the frame attachment portion 1120 of the front left attachment member 1100 and the frame attachment portion 1220 of the front right attachment member 1200 are at least partly in contact with the front end surfaces 122 of the left and right vertical support units 104. The abutment of the frame attachment portions 1120, 1220 with the front end surfaces 122 of the vertical support units 104 limits the position of the rack 10 along the depth direction, thereby ensuring that a center of gravity of the rack 10 is positioned appropriately along the depth direction to prevent significant weight imbalances in that direction (i.e., avoiding the rack 10 being too far rearward or too far frontward relative to the rack-supporting frame 102). The abutment of the frame attachment portions 1120, 1220 with the front end surfaces 122 of the vertical support units 104 may cause mechanical stress on the front left and front right attachment members 1100 and 1200. The spring portions 1130, 1230 may absorb the mechanical stress by allowing a certain amount of elastic deformation of the front attachment members 1100, 1200 as described above. Therefore, the spring portions 1130, 1230 may provide a greater tolerance to mechanical stress during insertion of the rack 10 to facilitate positioning the rack 10 on the rack-supporting frame 102.

Once the front left and front right attachment members 1100, 1200 are in contact with the front end surfaces 122 of the left and right vertical support units 104, the rack 10 can be lowered so that the base 22 of the rack 10 is supported, either by a ground surface of the data center, a supporting component of the rack-supporting frame 102, or the upper end 19 of another rack 10 (if the rack 10 is being stacked atop another rack 10).

Figure 11:
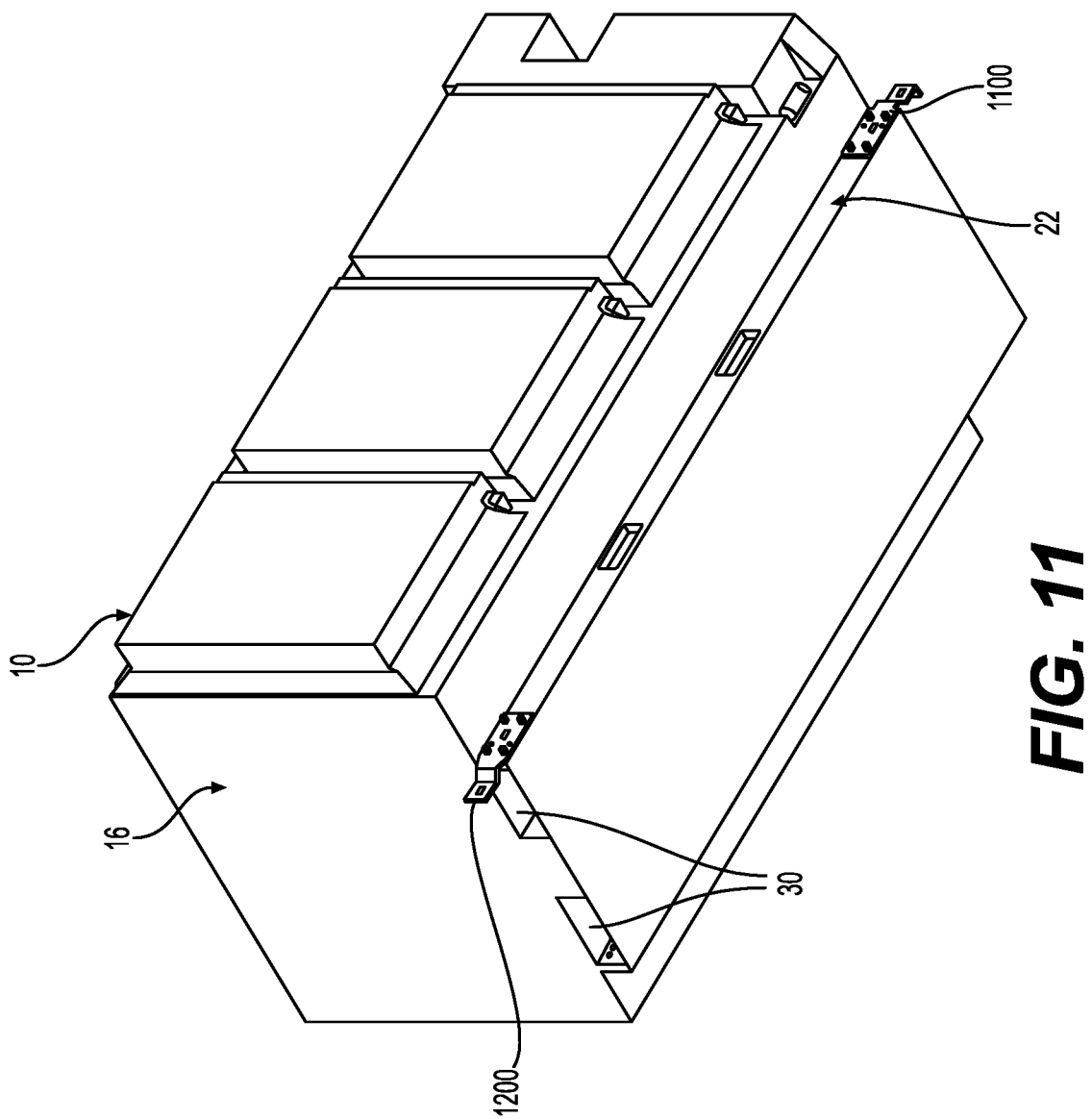
FIG. 11 is a is a perspective view, taken from a rear, bottom, right side, of the rack of the rack system of FIG. 1 with rear left and right attachment members connected thereto.

The rear left attachment member 1100 and the rear right attachment member 1200 are then affixed to the rear side of the rack 10. In particular, the rear left attachment member 1100 and the rear right attachment member 1200 are connected to the rear wall 67 of the base 22 on the rear side of the rack 10. Alternatively, the rear left and rear right attachment members 1100, 1200 can be connected to the rack 10 before the rack 10 is lowered to be supported by the ground surface of the data center, a supporting component of the rack-supporting frame 102, or the upper end 19 of another rack 10. Once the rear left and rear right attachment members 1100, 1200 are connected to the rack 10, a part of each of the rear left attachment member 1100 and the rear right attachment member 1200 extends leftward and rightward respectively from a left end and a right end of the base 22 of the rack 10. Notably, in this embodiment, the hook portion 1110, the frame attachment portion 1120 and the spring portion 1130 of the rear left attachment member 1100 extend leftward from the left end of the base 22 of the rack 10, while the frame attachment portion 1220 and the spring portion 1230 of the rear right attachment member 1200 extend rightward from the right end of the base 22 of the rack 10. For instance, FIG. 11 shows the rear left and rear right attachment members 1100, 1200 connected to the rear side of the rack 10, with the left and right vertical support units 104 removed for clarity.

As mentioned above, in this embodiment, each of the front left and rear left attachment member 1100 has a corresponding hook portion 1110. In other words, the rear left attachment member 1100 is configured identically to the front left attachment member 1100, and the rear right attachment member 1200 is configured identically to the front right attachment member 1200. It is contemplated that, in other embodiments, only the front left attachment member 1100 is provided with the hook portion 1110, while the rear left attachment member is identical to the front right attachment member 1200 and the rear right attachment member 1200 (i.e., it would have no hook portion).

In this embodiment, once the front and rear attachment members 1100, 1200 are connected to the rack 10, the rack 10 is moved rightward until the hook portions 1110 of the front left and rear left attachment members 1100 abut respective left side end surfaces 123 (FIG. 9) of the left vertical support unit 104. In this embodiment, the left side end surfaces 123 are defined by the front and rear elongated vertical members 106, 108. More specifically, the rack 10 is moved rightward until an inward side of the hook portion 1110 of the front left attachment member 1100 and an inward side of the hook portion 1110 of the rear left attachment member 1100 abut the left side end surfaces 123 of the left vertical support unit 104. A lateral position of the rack 10 between the left and right vertical support units 104 is guided by interaction between the hook portions 1110 of the front left and rear left attachment members 1100 and the left vertical support unit 104. Therefore, the hook portions 1110 facilitate a lateral positioning of the rack 10 as a correct lateral position is set by the abutment of the hook portions 1100 with the vertical support units 104.

At this point, the openings 1122, 1222 of the frame attachment portions 1120, 1220 of the front left, front right, rear left and rear right attachment members 1100, 1200 are aligned with openings defined by the rack-supporting frame 102, particularly defined by the front and rear vertical elongated members 106, 108 so that fasteners 600 (one of which is shown in FIG. 9) connect the attachment members 1100, 1200 to the rack-supporting frame 102, thereby securing the rack 10 between the left and right vertical support units 104.

It is contemplated that, in other embodiments, the front left and front right attachment members 1100, 1200 may be secured to the rack supporting frame 102 prior to affixing the rear left and rear right attachment members to the rear side of the rack 10.

Depending on how many racks 10 are to be disposed above one another, the operator can then proceed to repeat the steps of the method to position another rack 10 above the rack 10 that is already in place.

The method thus provides a simple and time-efficient manner in which a rack can be positioned on the rack-supporting frame 102 while ensuring that it is properly aligned relative to the vertical support units 104. The alignment of the rack 10 relative to the rack-supporting frame 102 can be particularly useful in ensuring that the weight of the rack 10 is properly distributed, thereby avoiding significant weight imbalances which could be hazardous for instance when manipulating equipment housed by the rack 10 (e.g., the servers, heat exchangers, etc.). Moreover, the method allows positioning the racks 10 in predetermined positions in a repeatable manner which can facilitate connecting equipment supported by the racks 10 (e.g., servers, heat exchangers, etc.) to respective connections such as a power supply connection, a fluid supply connection and other connections which might otherwise be difficult to connect if the racks 10 are not properly aligned relative to the rack-supporting frame 102.

Fastening the front left, front right, rear left and rear right attachment members to the rack 10 and the rack-supporting frame 102 may also be helpful to prevent the rack 10 from tilting frontwards or rearwards. For instance, when removing servers from the rack 10 from the front side thereof, the center of gravity of the rack 10 can be shifted frontwardly due to the weight of the servers. Therefore, preventing the tilting of the rack 10 may ensure safe maintenance operations on the rack 10.

Furthermore, the method as described above may limit deformation of one or more of the racks 10 when the racks 10 are stacked atop one another and may consequently limit tilting of the stack of racks 10. Notably, when multiple racks 10 are stacked atop one another (for example three, four or more racks 10) without a supporting connection to the rack-supporting frame 102, the racks 10 supporting other racks 10 can be deformed under the weight of the supported racks 10. This deformation can be non-uniform, namely as the front or rear side of the racks 10 can have greater structural strength, thereby causing the stack of racks 10 to bend forwardly or rearwardly. Connection to the rack-supporting frame 102 once such deformation has taken place can be difficult. By positioning the racks 10 relative to the rack-supporting frame 102, namely by the abutment between the frame attachment portions 1120, 1220 and the front end surfaces 122 of the vertical support units 104 as described above, and connecting the racks 10 to the rack-supporting frame 102, such tilting of the stack of racks 10 is limited.

In the above-described embodiment, the front left attachment member 1100 has a hook portion 1110 and the front right attachment member 1200 does not have a hook portion. Therefore, the rack 10 is moved rightward upon being laterally positioned as described above. However, it is contemplated that in other embodiments the front left attachment member 1100 and the front right attachment member 1200 may be inverted such that the front right attachment member 1200 has the hook portion 1110 and the front left attachment member 1100 does not have the hook portion. In such embodiments, the rack 10 is moved leftward in order to set the lateral position of the rack 10 between the left and right vertical support units 104 by engagement of the hook portion 1110 with a right side end surface 125 of the front elongated vertical member 108 of the right vertical support unit 104. Moreover, in such embodiments, as the rear attachment member having the hook portion 1110 would be on the same side as the front attachment member having the hook portion 1110 (in embodiments in which the corresponding rear attachment has a hook portion), the rear right attachment member is provided with a hook portion 1110 instead of the rear left attachment member such that the hook portion 1110 engages a corresponding right side end surface 125 of the rear elongated vertical member 108 of the right vertical support unit 104. Therefore, the rack 10 is moved rightward or leftward upon being laterally positioned between the left and right vertical support units 104 depending on if the front left and rear left attachment members have the hook portion or if the front right and rear right attachment members have the hook portion.

Alternatively, it is contemplated that, in other embodiments, the front and rear attachment members may be inverted such that only one of the rear left or rear right attachment members comprises a hook portion 1110 and the front right and front left attachment members 1100, 1200 does not comprise a hook portion 1110. The rack 10 is thus moved rightward or leftward upon being laterally positioned between the left and right vertical support units 104 depending on if the rear left attachment member has the hook portion or if the rear right attachment member has the hook portion.

Figure 12:
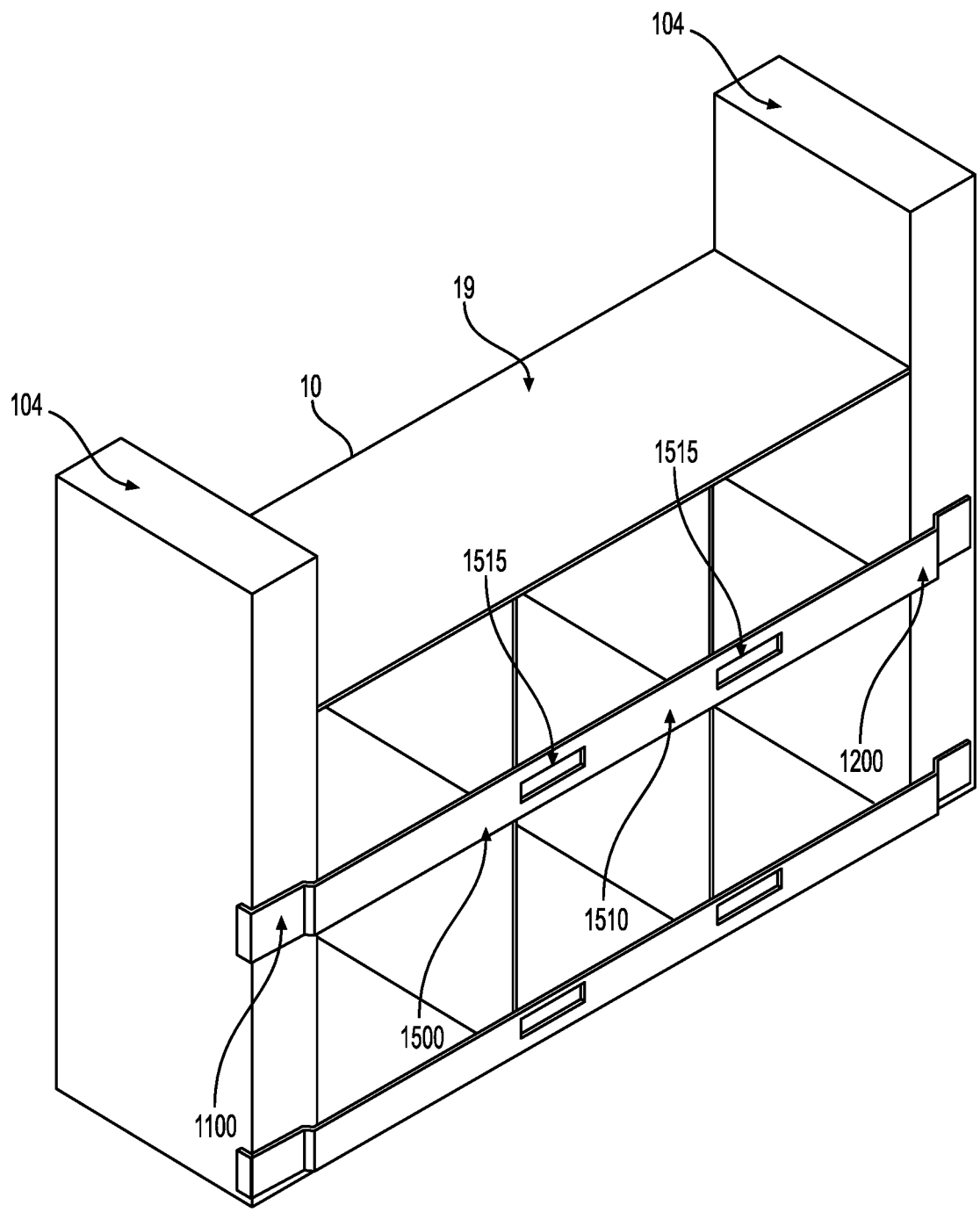
FIG. 12 is a perspective view of a rack connected to the rack-supporting frame by a single front attachment member according to an alternative embodiment.

Although in this embodiment two separate front left and front right attachment members 1100 and 1200 are provided, it is contemplated that, in other embodiments, a single front attachment member may be provided incorporating the front left and front right attachment members 1100 and 1200. For instance, with reference to FIG. 12, in an alternative embodiment, a single front attachment member 1500 is provided that extends from both lateral ends of the base 22 of the rack 10, with a left section and a right section which can be referred to as a front left and a front right attachment sections that are identical to the front left and front right attachment members 1100, 1200 described above and will therefore be referred to with the same reference numerals. The left and right vertical support unit 104 have been illustrated schematically in FIG. 12 for simplified reference thereto. The single front attachment member 1500 has a central section 1510 extending between the rack attachment portion 1140 of the front left attachment section 1100 and the rack attachment portion 1240 of the front right attachment section 1200. In this embodiment, the central portion 1510 defines openings 1515 aligned with the openings 50 of the base 22 to prevent the front attachment member 1500 from blocking the openings 50 which, as discussed above, receive respective arms of the fork of the lifting machine.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A method for positioning a data center rack relative to a rack-supporting frame, the rack-supporting frame comprising left and right vertical support units laterally spaced apart from one another, the method comprising:
    connecting at least one front attachment member to the data center rack on a front side thereof such that:
        part of one of the at least one front attachment member extends leftward from a left end of the data center rack; and
        part of one of the at least one front attachment member extends rightward from a right end of the data center rack;
    lifting the data center rack;
    inserting the data center rack between the left and right vertical support units until the at least one front attachment member abuts the left and right vertical support units; and
    moving the data center rack leftward or rightward until a hook portion of the at least one front attachment member engages the left vertical support unit or the right vertical support unit to set a lateral position of the data center rack between the left and right vertical support units.

2. The method of claim 1, further comprising, after inserting the data center rack between the left and right vertical support units, lowering the data center rack until a bottom of the data center rack is supported.

3. The method of claim 1, further comprising, after inserting the data center rack between the left and right vertical support units:
    connecting at least one rear attachment member to the data center rack on a rear side thereof such that:
        part of one of the at least one rear attachment member extends leftward from the left end of the data center rack; and
        part of one of the at least one rear attachment member extends rightward from the right end of the data center rack.

4. The method of claim 3, wherein:
    when moving the data center rack leftward or rightward, a hook portion of the at least one rear attachment member engages the left vertical support unit or the right vertical support unit, the hook portion of the at least one front attachment and the hook portion of the at least one rear attachment member being disposed on a same lateral side of the data center rack, engagement of the hook portion of the at least one front attachment member and the hook portion of the at least one rear attachment member with the left vertical support unit or the right vertical support unit setting a lateral position of the data center rack between the left and right vertical support units.

5. The method of claim 1, further comprising, after moving the data center rack leftward or rightward:

connecting the part of the one of the at least one front attachment member that extends leftward from the left end of the data center rack to the left vertical support unit; and connecting the part of the one of the at least one front attachment member that extends rightward from the right end of the data center rack to the right vertical support unit.

6. The method of claim 4, further comprising, after moving the data center rack leftward or rightward:

connecting the part of the one of the at least one rear attachment member that extends leftward from the left end of the data center rack to the left vertical support unit; and connecting the part of the one of the at least one rear attachment member that extends rightward from the right end of the data center rack to the right vertical support unit.

7. The method of claim 1, wherein:

the at least one front attachment member includes a front left attachment member and a front right attachment member; and connecting the at least one front attachment member to the data center rack comprises:

connecting the front left attachment member to the data center rack on the front side thereof such that part of the front left attachment member extends leftward from the left end of the data center rack; and connecting the front right attachment member to the data center rack on the front side thereof such that part of the front right attachment member extends rightward from the right end of the data center rack.

8. A rack system comprising:

a rack-supporting frame comprising a left vertical support unit and a right vertical support unit laterally spaced apart from one another;

a data center rack positioned between the left vertical support unit and the right vertical support unit, the data center rack having a front side and a rear side opposite the front side;

at least one front attachment member connected to the data center rack on the front side thereof, part of one of the at least one front attachment member extending leftward from a left end of the data center rack and being connected to the left vertical support unit, part of one of the at least one front attachment member extending rightward from a right end of the data center rack and being connected to the right vertical support unit; and at least one rear attachment member connected to the data center rack on the rear side thereof, part of one the at least one rear attachment member extending leftward from the left end of the data center rack and being connected to the left vertical support unit, part of one of the at least one rear attachment member extending rightward from the right end of the data center rack and being connected to the right vertical support unit, the at least one front attachment member comprising a hook portion abutting a surface of a corresponding one of the left and right vertical support units to set a lateral position of the data center rack between the left and right vertical support units.

9. The rack system of claim 8, wherein each of the at least one front attachment member and each of the at least one rear attachment member is a piece of sheet metal formed into shape by bending.

10. The rack system of claim 8, wherein each of the at least one front attachment member and each of the at least one rear attachment member comprises:

a rack attachment portion connected to the data center rack;

a frame attachment portion connected to a corresponding one of the left and right vertical support units; and a spring portion extending between the rack attachment portion and the frame attachment portion, the spring portion allowing elastic deformation of the attachment member such that the rack attachment portion is movable relative to the frame attachment portion.

11. The rack system of claim 10, wherein the rack attachment portion is generally parallel to the frame attachment portion.

12. The rack system of claim 10, wherein the spring portion extends at least partly in the depth direction of the data center rack.

13. A data center rack comprising:

a front side and a rear side spaced apart in a depth direction of the data center rack;

a plurality of attachment members for connecting the data center rack to a rack-supporting frame, each attachment member of the plurality of attachment members comprising:

a rack attachment portion connected to the data center rack;

a frame attachment portion configured to be connected to a corresponding one of a left vertical support unit and a right vertical support unit of the rack-supporting frame, wherein the rack attachment portion is generally parallel to the frame attachment portion;

a hook portion configured to abut a surface of the corresponding one of the left and right vertical support units to set a lateral position of the data center rack between the left and right vertical support units; and a spring portion extending between the rack attachment portion and the frame attachment portion, the spring portion allowing elastic deformation of the attachment member such that the rack attachment portion is movable relative to the frame attachment portion.

14. The data center rack of claim 13, wherein the spring portion extends at least partly in the depth direction of the data center rack.

15. The data center rack of claim 13, wherein the spring portion extends at a non-right angle relative to the rack attachment portion and the frame attachment portion.

16. The data center rack of claim 13, wherein the spring portion comprises:

a first section extending from the rack attachment portion;

a second section extending from the frame attachment portion, the second section being generally parallel to the first section; and a third section extending between the first and second sections, the third section extending an angle relative to the first and second sections.

17. The data center rack of claim 13, wherein the hook portion extends at an angle relative to the frame attachment portion.

18. The data center rack of claim 13, wherein each attachment member is a piece of sheet metal formed into shape by bending.

19. The rack system of claim 10, wherein the spring portion comprises:

a first section extending from the rack attachment portion;

a second section extending from the frame attachment portion, the second section being generally parallel to the first section; and a third section extending between the first and second sections, the third section extending an angle relative to the first and second sections.

20. The rack system of claim 10, wherein the spring portion extends at a non-right angle relative to the rack attachment portion and the frame attachment portion.

* * * * *

UNITED STATES PATENT AND TRADEMARK OFFICE
CERTIFICATE OF CORRECTION

| | |
|---|---|
| PATENT NO. | : 11,792,953 B2 |
| APPLICATION NO. | : 17/677197 |
| DATED | : October 17, 2023 |
| INVENTOR(S) | : Chehade et al. |

It is certified that error appears in the above-identified patent and that said Letters Patent is hereby corrected as shown below:

In the Claims

Column 16, Claim 8, Line 1 should read --part of one of the at least one rear attachment member--

Column 17, Claim 16, Line 6 should read --sections, the third section extending at an angle relative to--

Column 17, Claim 19, Line 21 should read --sections, the third section extending at an angle relative to--

Signed and Sealed this
Twelfth Day of December, 2023

*Katherine Kelly Vidal*

Katherine Kelly Vidal
*Director of the United States Patent and Trademark Office*